United States Patent
He et al.

(10) Patent No.: US 12,312,669 B2
(45) Date of Patent: May 27, 2025

(54) MASK PLATE ASSEMBLY

(71) Applicants: Chengdu BOE Optoelectronics Technology Co., Ltd., Sichuan (CN); BOE Technology Group Co., Ltd., Beijing (CN)

(72) Inventors: Panting He, Beijing (CN); Leifang Xiao, Beijing (CN)

(73) Assignees: Chengdu BOE Optoelectronics Technology Co., Ltd., Sichuan (CN); BOE Technology Group Co., Ltd., Beijing (CN)

(*) Notice: Subject to any disclaimer, the term of this patent is extended or adjusted under 35 U.S.C. 154(b) by 565 days.

(21) Appl. No.: 17/789,173

(22) PCT Filed: Mar. 10, 2021

(86) PCT No.: PCT/CN2021/079862
§ 371 (c)(1),
(2) Date: Jun. 25, 2022

(87) PCT Pub. No.: WO2021/218412
PCT Pub. Date: Nov. 4, 2021

(65) Prior Publication Data
US 2023/0036857 A1 Feb. 2, 2023

(30) Foreign Application Priority Data

Apr. 26, 2020 (CN) .......................... 202020656789.7

(51) Int. Cl.
*C23C 14/04* (2006.01)
*C23C 14/24* (2006.01)

(52) U.S. Cl.
CPC ............ *C23C 14/042* (2013.01); *C23C 14/24* (2013.01)

(58) Field of Classification Search
CPC ....... C23C 14/24; C23C 14/042; C23C 14/04; H10K 71/70; H10K 71/166
See application file for complete search history.

(56) References Cited

U.S. PATENT DOCUMENTS 10,982,314 B2 * 4/2021 Lin ........................ C23C 14/042
2021/0280788 A1 9/2021 Ding et al.

FOREIGN PATENT DOCUMENTS

| CN | 108893710 A | 11/2018 |
| CN | 108977762 A | 12/2018 |
| CN | 110029322 A | 7/2019 |

(Continued)

OTHER PUBLICATIONS

PCT/CN2021/079862 international search report and written opinion.

*Primary Examiner* — Jaehwan Oh
(74) *Attorney, Agent, or Firm* — IPro, PLLC (57) ABSTRACT

A mask plate assembly is provided, including a first mask plate and multiple types of first mask strips having different effective evaporation patterns, where the first mask plate includes a first frame and a first support strip arranged between a set of opposite sides of the first frame, a first hollowed-out portion including multiple first holes is arranged in a first region of the first support strip, and the multiple first holes are used for cooperating with the multiple types of first mask strips for evaporation to form different first functional structures.

12 Claims, 6 Drawing Sheets

(56) References Cited

FOREIGN PATENT DOCUMENTS

| | | |
|---|---|---|
| CN | 110066975 A | 7/2019 |
| CN | 212025440 U | 11/2020 |
| JP | 2000039514 A | 2/2000 |

* cited by examiner

MASK PLATE ASSEMBLY

CROSS-REFERENCE TO RELATED APPLICATIONS

This application is the U.S. national phase of PCT Application No. PCT/CN2021/079862 filed on Mar. 10, 2021, which claims priority to Chinese Patent Application No. 202020656789.7 filed in China on Apr. 26, 2020, which are incorporated in their entirety by reference herein.

TECHNICAL FIELD

The present disclosure relates to the field of display product fabrication, and in particular to a mask plate assembly.

BACKGROUND

OLED (Organic Light-Emitting Diode) screens have the advantages of high brightness, good image quality, energy saving and so on, which have become the development trend of panel industry, and are also the high-end products in panel industry. In addition to their high prices, requirements of the customers on the OLED screens are increasing. Currently, in the OLED industry, the method of mask is adopted to form luminescent materials through evaporation.

The shielding of AA region in the current EV mask is mostly performed by means of F-mask (fine metal mask). Since different EL (light-emitting layer) films are formed through evaporation in different chambers and there are many contents to be tested in each chamber, such as evaporation PPA (position accuracy), film thickness, optical performance, electrical performance, etc., many holes are designed in the F-mask, and the positions of the holes in the F-mask corresponding to different films are different. Hence, REML (red light-emitting layer), GEML (green light-emitting layer), BEML (blue light-emitting layer), RHTL (red auxiliary light-emitting layer) and GHTL (green auxiliary light-emitting layer) correspond to five different F-mask sheets (mask plate assemblies), and in mask manufacture, molding making needs to be performed for five times, which not only results in high cost, but also causes relatively long time for mask manufacture. In addition, in the process of mask manufacturing, there may be one or several masks being manufactured wrongly, or being damaged, etc.; if the damaged F-masks are all F-masks corresponding to a chamber, the FMM corresponding to the chamber may not be able to be stretched, EL devices cannot be formed through evaporation according to the schedule and the repair or remanufacturing of the damaged F-masks takes a longer time, which leads to delay in a project schedule, and more seriously, results in delay in the first sample schedule.

SUMMARY

In order to address the above-mentioned technical problem, the present disclosure provides a mask plate assembly, which solves the problem that cost of forming EL devices through evaporation is high and a delay occurs in the whole evaporation process in a case of damage of some masks.

In order to achieve the above-mentioned object, the technical solution adopted by the present disclosure is as follow. A mask plate assembly is provided, including a first mask plate and multiple types of first mask strips having different effective evaporation patterns, where the first mask plate includes a first frame and a first support strip arranged between a set of opposite sides of the first frame, a first hollowed-out portion including multiple first holes is arranged in a first region of the first support strip, and the multiple first holes are used for cooperating with the multiple types of first mask strips for evaporation to form different first functional structures;

the first hollowed-out portion includes three first holes, and the three first holes comprise a first sub-hole, a second sub-hole and a third sub-hole, where the first sub-hole is used for evaporation to form a first functional structure for testing a first property of a first colour light-emitting layer on a display substrate, the second sub-hole is used for evaporation to form a first functional structure for testing the first property of a second colour light-emitting layer on the display substrate, and the third sub-hole is used for evaporation to form a first functional structure for testing the first property of a third colour light-emitting layer on the display substrate.

Optionally, the number of types of the first mask strips is three, where an orthographic projection of the effective evaporation pattern of each of the first mask strips onto the first mask plate is within a corresponding one of the first holes.

Optionally, a second mask plate and multiple types of second mask strips having different effective evaporation patterns are further included, where the second mask plate includes a second frame and a second support strip arranged between a set of opposite sides of the second frame, a second hollowed-out portion including multiple second holes is arranged in a second region of the second support strip, and the multiple second holes are used for cooperating with the multiple types of second mask strips for evaporation to form different second functional structures.

Optionally, the second hollowed-out portion includes two second holes, and the two second holes include a fourth sub-hole and a fifth sub-hole, where the fourth sub-hole is used for evaporation to form a second functional structure for testing the first property of a first colour auxiliary light-emitting layer on the display substrate, and the fifth sub-hole is used for evaporation to form a second functional structure for testing the first property of a second colour auxiliary light-emitting layer on the display substrate.

Optionally, the number of types of the second mask strips is two, where an orthographic projection of the effective evaporation pattern of each of the second mask strips onto the second mask plate is within a corresponding one of the second holes.

Optionally, the second mask strips includes a first sub-mask strip and a second sub-mask strip, the first sub-mask strip is used for forming the second functional structure for testing the first property of the first colour auxiliary light-emitting layer, the second sub-mask strip is used for forming the second functional structure for testing the first property of the second colour auxiliary light-emitting layer, the first mask strips includes a third sub-mask strip and a fourth sub-mask strip, the third sub-mask strip is used for forming the first functional structure for testing the first property of the first colour light-emitting layer, and the fourth sub-mask strip is used for forming the first functional structure for testing the first property of the second colour light-emitting layer;

the first sub-mask strip is further used as the third sub-mask strip, and the second sub-mask strip is further used as the fourth sub-mask strip.

Optionally, third mask strips having different effective evaporation patterns are further included, where a third hollowed-out portion having multiple third holes is arranged in a third region on the first support strip on the first mask plate, and the multiple third holes are used for cooperating with the multiple types of third mask strips for evaporation to form different third functional structures.

The third hollowed-out portion at least includes three third holes, the three third holes are used for cooperating with the first mask plate for evaporation to form the third functional structures for respectively testing second properties of the first colour light-emitting layer, the second colour light-emitting layer and the third colour light-emitting layer.

Optionally, fourth mask strips having different effective evaporation patterns are further included, where a fourth hollowed-out portion having multiple fourth holes is arranged in a fourth region on the second support strip on the second mask plate, and the multiple fourth holes are used for cooperating with the multiple types of fourth mask strips for evaporation to form different fourth functional structures.

Optionally, the fourth hollowed-out portion at least includes two fourth holes, the two fourth holes are used for cooperating with the second mask plate for evaporation to form the fourth functional structures for respectively testing the second properties of a first colour auxiliary light-emitting layer, a second colour auxiliary light-emitting layer and a third colour auxiliary light-emitting layer.

Advantageous effects of the present disclosure are: by providing a first hollowed-out portion having multiple holes in a first region of the first support strip, a mask plate cooperating with multiple first mask strips having different effective evaporation patterns to perform evaporation can be commonly used, so that costs can be saved, and the entire evaporation process may not be delayed even if some of mask plates are damaged.

DETAILED DESCRIPTION

In order that the objects, technical solutions and advantages of the embodiments of the present disclosure will become clearer, a more detailed description of the embodiments of the present disclosure will be rendered by reference to the accompanying drawings. It is to be understood that the described embodiments are some, but not all, of embodiments of the present disclosure. Based on the described embodiments of the present disclosure, all other embodiments available to one of ordinary skill in the art are within the scope of the present disclosure.

In the description of the present disclosure, it should be noted that the terms "central", "above", "below", "left", "right", "vertical", "horizontal", "inner", "outer" and the like indicate orientations or positional relationships based on the orientations or positional relationships shown in the figures, which are merely used to facilitate description of the present disclosure and simplify the description, and do not indicate or imply that the referenced devices or elements must have a particular orientation, be constructed and operated in a particular orientation, and thus should not be construed as limiting the present disclosure. Furthermore, the terms "first", "second", and "third" are used for descriptive purposes only and are not to be construed as indicating or implying relative importance.

In conventional mask plate design, mold making needs to be performed for five times. Not only is the cost high, but also the time for mask plate manufacturing is long. If an accident occurs in the production of the mask plate, the entire project may be delayed.

In view of the above-mentioned problems, the present embodiments provide a mask plate assembly, including a first mask plate 01 and multiple types of first mask strips 4 with different effective evaporation patterns. The first mask plate 01 includes a first frame 011 and a first support strip 2 arranged between a set of opposite sides of the first frame 011, a first hollowed-out portion 21 including multiple first holes 210 is arranged in a first region of the first support strip 2, and the multiple first holes 210 are used for cooperating with the multiple types of first mask strips 4 to perform evaporation so as to form different first functional structures, with reference to FIG. 1.

By providing a first hollowed-out portion 21 having multiple holes in a first region of the first support strip 2, a mask plate cooperating with multiple types of first mask strips 4 having different effective evaporation patterns to perform evaporation can be commonly used, so that costs can be saved, and even if some of the mask plates are damaged, the whole evaporation process will not be delayed.

In the conventional technologies, a mask strip corresponds to a type of mask plate, which are used for evaporation to form a functional structure; the mask plates used for forming different functional structures cannot be interchangeable with each other; the number of the functional structures formed through evaporation is the same as the number of the mask plates; the corresponding mask plates each need to be manufactured by mold making separately, which is costly and takes a long time; and if some mask plates are damaged, the whole process flow may be delayed. In the present embodiments, a mask plate can cooperate with multiple types of mask strips, that is, the mask plates forming multiple functional structures can be interchangeable with each other, reducing the number of times of mold making when manufacturing the mask plates, reducing costs and shortening the manufacturing duration of the mask plates. In addition, the first mask plate 01 in the present embodiments can be commonly used, and it is feasible to borrow the first mask plates from each other when manufacturing multiple first functional structures, greatly avoiding the case where the whole project is delayed due to the problem of the mask plate corresponding to one evaporation chamber, and greatly reducing the risk of project delay.

Figure 3:
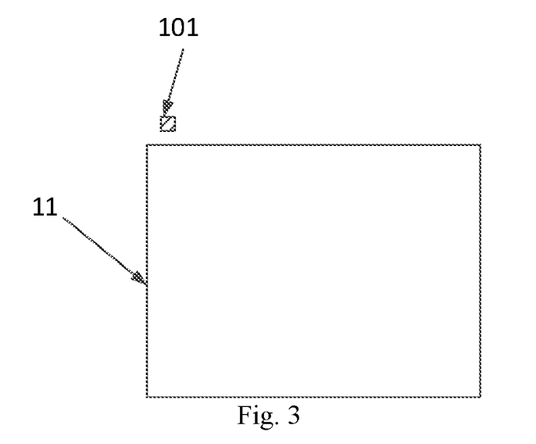
FIG. 3 shows a schematic diagram of a first functional structure formed through evaporation for testing a first property of a first color light-emitting layer in embodiments of the present disclosure.
Figure 4:
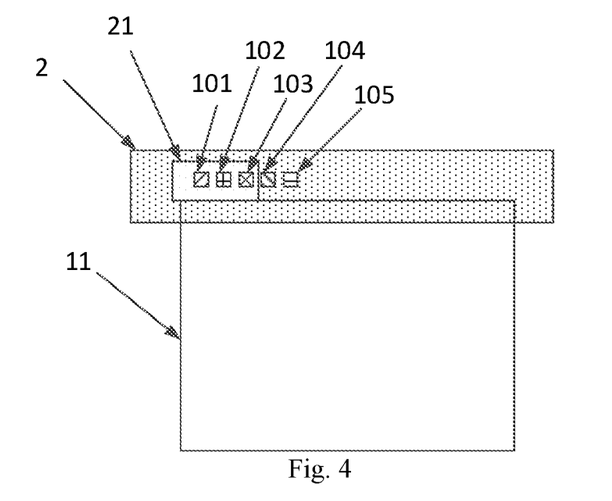
FIG. 4 shows a schematic diagram of partial structure of a first mask plate corresponding to a display substrate where evaporation is to be performed in embodiments of the present disclosure.
Figure 5:
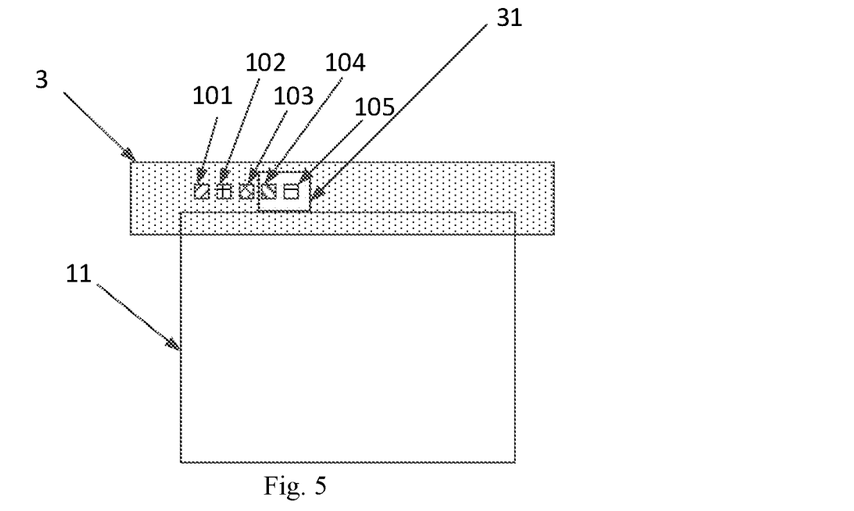
FIG. 5 shows a schematic diagram of partial structure of a second mask plate corresponding to a display substrate where evaporation is to be performed in embodiments of the present disclosure.
Figure 6:
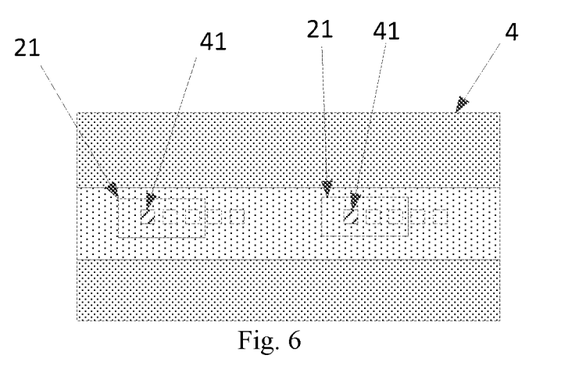
FIG. 6 shows a schematic diagram of a first mask plate cooperating with a first mask strip in embodiments of the present disclosure.
Figure 7:
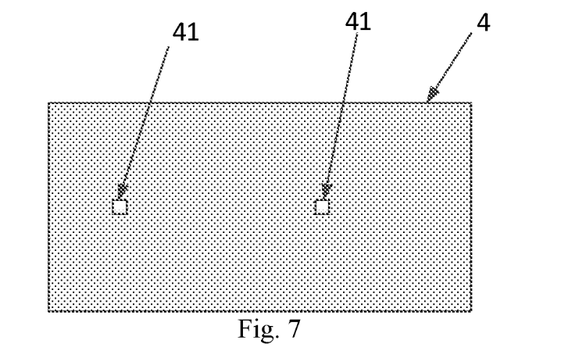
FIG. 7 shows a schematic diagram of a first mask strip in embodiments of the present disclosure.
Figure 12:
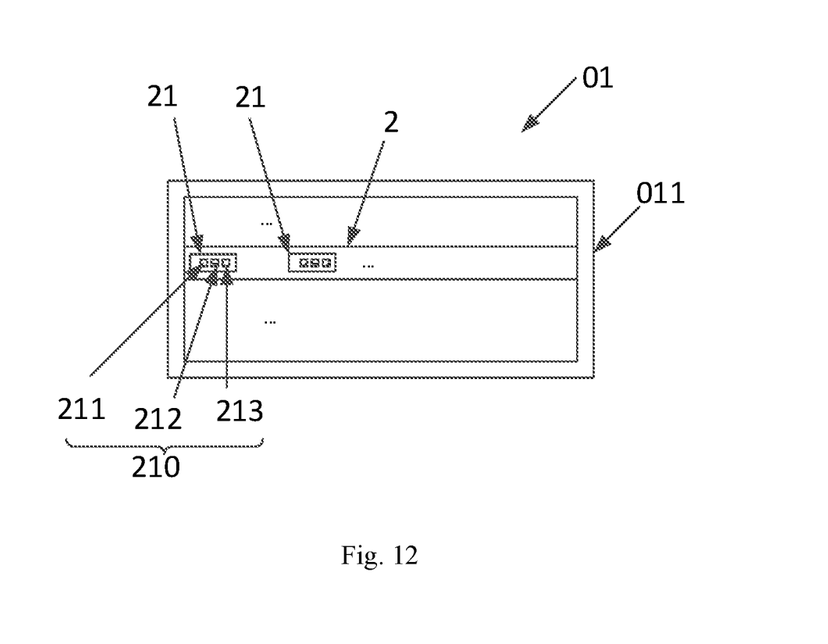
FIG. 12 shows a first schematic diagram of partial structure of a first mask plate according to embodiments of the present disclosure.

Reference is made to FIGS. 3, 4 and 12, for example, three first functional structures (a first sub-functional structure 101, a second sub-functional structure 102 and a third sub-functional structure 103) need to be formed by evaporation respectively in three evaporation chambers; the first hollowed-out portion 21 includes three first holes 210 (a first sub-hole 211, a second sub-hole 212 and a third sub-hole 213); when performing evaporation, an effective evaporation pattern 41 on a type of first mask strip 4 corresponds to the first sub-hole 211 so as to form the first sub-functional structure 101 by evaporation; the positions of the second sub-hole 212 and the third sub-hole 213 are sheltered by the mask strip and cannot be used for evaporation. Reference is made to FIGS. 4, 6 and 7. An effective evaporation pattern on a type of first mask strip 4 corresponds to the second sub-hole 212 so as to form a second sub-functional structure 102 through evaporation, while the first sub-hole 211 and the third sub-hole 213 are sheltered by the mask strip and cannot be used for evaporation; an effective evaporation pattern on a type of first mask strip 4 corresponds to the third sub-hole 213 so as to form a third sub-functional structure 103 through evaporation; and due to the arrangement of the first hollowed-out portion 21, the positions of the first sub-hole 211 and the second sub-hole 212 are sheltered by the mask strip and cannot be used for evaporation; the mask plates for forming the first sub-functional structure 101, the second sub-functional structure 102 and the third sub-functional structure 103 by evaporation can be interchangeable with each other, that is, the mask plates for forming three types of first functional structures through evaporation can be manufactured with one time of mold making, which reduces the manufacturing cost and shortens the manufacturing time; and when the mask plate for forming one of the first functional structures by evaporation is damaged, the mask plates for forming the other two first functional structures can be borrowed for evaporation, so as to avoid delay in the overall process flow.

It should be noted that the number of the types of the first mask strips 4 is the same as the number of the types of the first functional structures to be formed, the number of the first holes 210 in one of the first hollowed-out portions 21 is the same as the number of the types of the first mask strips 4, and the number of the first hollowed-out portions 21 included on each of the first mask plates 01 may be set according to actual needs.

It should be noted that there is only one first support strip 2 in the first mask plate 01 shown in FIG. 12, and the number of the first support strips 2 may be set according to actual needs. The arrangement direction of the first support strips 2 may be set according to actual needs, the first mask plate 01 may only include first support strips 2 extending along one direction, or the first mask plate 01 may include first support strips 2 arranged along multiple extension directions. An exemplary structure of the first mask plate 01 is shown in FIG. 12, and the present disclosure is not limited thereto.

It should be understood that the first mask plate shown in FIG. 12 is merely a schematic diagram showing the composition result of the first mask plate, and the length-width ratio of the first support strip and the length-width ratio of the first frame may be set in actual need and are not limited thereto.

In an implementation of the embodiments, the first support strip 2 is a plate-shaped structure in the first frame 011, at least one first hollowed-out portion 21 is provided in the first support strip 2, each first hollowed-out portion 21 is provided at a position corresponding to a side of a display panel, and the present disclosure is not limited thereto.

The number of and the positions of the first holes 210 in the first hollowed-out portion 21 may be set according to actual needs, as long as it is ensured that the mask plate which is generic can cooperate with corresponding mask strips to form required functional structures.

It should be noted that multiple first holes 210 in the first hollowed-out portion 21 may be multiple individual small holes or the multiple first holes may be connected as a whole to form a large hole, and the evaporation area is determined by the effective evaporation pattern on the first mask strip.

In some implementations of the embodiments, the first hollowed-out portion 21 includes three first holes 210, and the three first holes 210 include a first sub-hole 211, a second sub-hole 212 and a third sub-hole 213. The first sub-hole 211 is used for evaporation to form a first functional structure for testing a first property of a first colour light-emitting layer on a display substrate, and the second sub-hole 212 is used for evaporation to form a first functional structure for testing the first property of a second colour light-emitting layer on the display substrate; the third sub-hole 213 is used for evaporation to form a first functional structure for testing the first property of the third colour light-emitting layer on the display substrate.

In a specific implementation of the embodiments, the first color light-emitting layer is a red light-emitting layer, the second color light-emitting layer is a green light-emitting layer, and the third color light-emitting layer is a blue light-emitting layer, but the present disclosure is not limited thereto.

In some embodiments, the first property is, but not limited to, evaporation position accuracy (PPA).

The three first holes 210 include a red hole (namely, a first sub-hole 211) corresponding to the evaporation position of the red light-emitting layer on the display substrate, a green hole (namely, a second sub-hole 212) corresponding to the evaporation position of the green light-emitting layer on the display substrate, and a blue hole (namely, a third sub-hole 213) corresponding to the evaporation position of the blue light-emitting layer on the display substrate. Reference is made to FIG. 4 and FIG. 12. The corresponding first functional structures are located on a side of the display panel, with reference to FIGS. 1-3. The first mask strips 4 include a red mask strip for forming a first functional structure for testing the first property of the red light-emitting layer, a green mask strip for forming a first functional structure for testing the first property of the green light-emitting layer, and a blue mask strip for forming a first functional structure for testing the first property of the blue light-emitting layer. When the red mask strip cooperates with the first mask plate 01 to perform evaporation in the first evaporation chamber, the effective evaporation pattern on the red mask strip corresponds to the red hole so as to expose the position where evaporation is to be performed, and in this case, the green hole and the blue hole are shielded by the red mask strip and cannot be used for evaporation. The schematic diagram of the structure after evaporation is shown in FIG. 3. Similarly, when the green mask strip cooperates with the first mask plate 01 to perform evaporation in the second evaporation chamber, the effective evaporation pattern on the green mask strip corresponds to the green hole so as to expose the position where evaporation is to be performed, and in this case, the red hole and the blue hole are sheltered by the red mask strip and cannot be used for evaporation; when the blue mask strip cooperates with the first mask plate 01 to perform evaporation in the third evaporation chamber, the effective evaporation pattern on the blue mask strip corresponds to the blue hole so as to expose the position to where evaporation is to be performed, and in this case, the green hole and the red hole are sheltered by the red mask strip and cannot be used for evaporation. Different functional structures may be formed through evaporation by the same type of mask plate in cooperation with different types of mask strips.

The first mask strip 4 shown in FIGS. 6 and 7 is a red mask strip for forming a first functional structure for testing a first property of the red light-emitting layer, and the effective evaporation pattern thereon includes a first effective evaporation pattern 41 corresponding to the first sub-hole 211 in the first hollowed-out portion 21.

It should be noted that the dotted holes in FIG. 6 indicate sheltered evaporation positions, that is, the dotted holes indicate positions that are sheltered by the first mask strip 4 and cannot be used for evaporation.

In some implementations of the embodiments, the number of the types of the first mask strips 4 is the same as the number of the first holes 210 in the first hollowed-out portion 21. When the first hollowed-out portion 21 includes three first holes 210, the mask plate assembly further includes three first mask strips 4, and an orthographic projection of an effective evaporation pattern of each of the first mask strips 4 onto the first mask plate 01 is located in a corresponding one of the first holes 210.

During the evaporation, the first mask strip 4 and the first mask plate 01 are successively stacked on the substrate where evaporation is to be performed, and the orthographic projection of the effective evaporation pattern of each of the first mask strips 4 onto the first mask plate 01 is located in the corresponding first hole 210, so that the corresponding the first hole 210 exposes the effective evaporation pattern of the first mask strip 4, facilitating the evaporation of a corresponding pattern.

In the embodiments, the mask plate assembly further includes a second mask plate 02 and multiple types of second mask strips 5 with different effective evaporation patterns; the second mask plate 02 includes a second frame 021 and a second support strip 3 arranged between a set of opposite sides of the second frame 021; a second hollowed-out portion 31 including multiple second holes 310 is arranged in a second region of the second support strip 3; and the multiple second holes 310 are used for cooperating with the multiple types of second mask strips 5 to perform evaporation so as to form different second functional structures. Reference is made to FIGS. 5, 8, 9 and 14.

With the arrangement of the first mask plate 01, the first hollowed-out portions 21 including the multiple first holes 210 is arranged in the first region of the first support strip 2. When other functional structures different from the first functional structure need to be formed through evaporation (namely, when the position of the region where evaporation is to be performed is located at a region outside the first region), other mask plates need to be used. With the arrangement of the second mask plate 02, the same mask plate can be used with the multiple second mask strips 5 which cooperate with the multiple second holes 310 to form the second functional structures which are different, that is, the mask plate that forms the multiple second functional structures can be in common use.

Figures 13, 14:
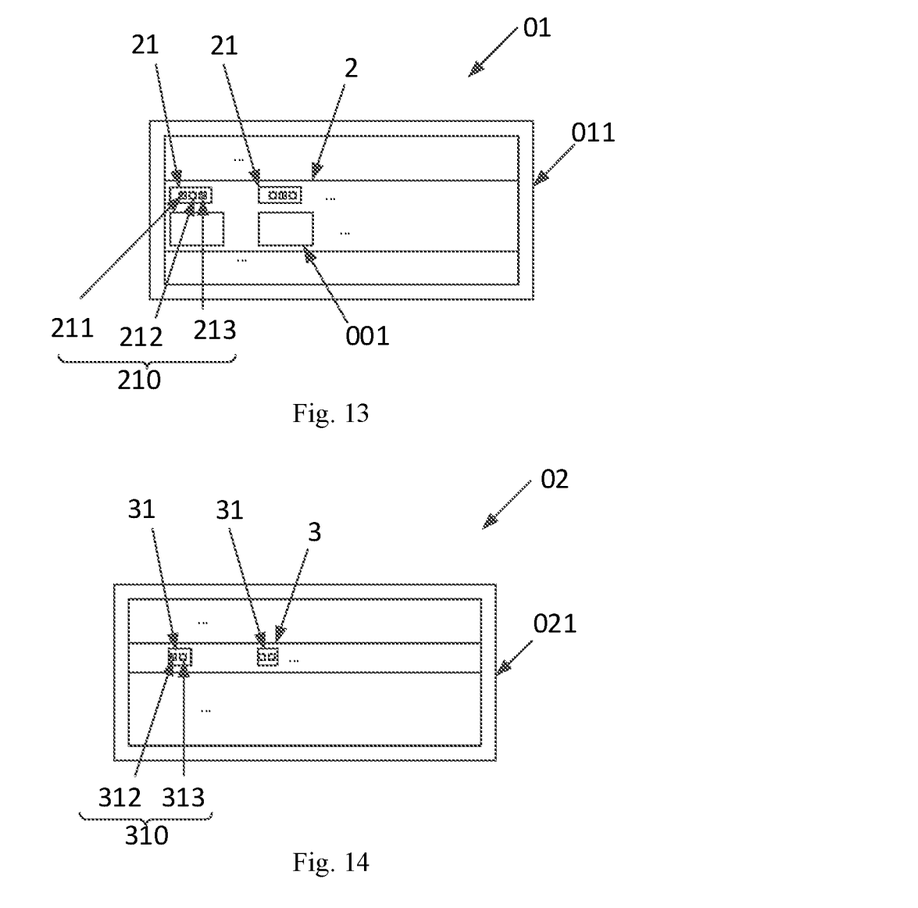
FIG. 13 shows a second schematic diagram of partial structure of a first mask plate according to embodiments of the present disclosure.
FIG. 14 shows a first schematic diagram of partial structure of a second mask plate according to embodiments of the present disclosure.

It should be noted that there is only one second support strip 3 in the second mask plate 02 shown in FIG. 14, and the number of the second support strips 3 may be set according to actual needs. The arrangement direction of the second support strips 3 may be set according to actual needs, the second mask plate 02 may only include second support strips 3 extending along one direction, or the second mask plate 02 may include second support strips 3 arranged along multiple extension directions. An exemplary structure of the second mask plate 02 is shown in FIG. 14, and the present disclosure is not limited thereto.

It should be understood that the second mask plate shown in FIG. 14 is merely a schematic diagram showing the composition result of the second mask plate, and the length-width ratio of the second support strip and the length-width ratio of the second frame may be set in actual need and are not limited thereto.

It should be noted that the number of the types of the second mask strips 5 is the same as the number of the types of the second functional structures to be formed, the number of the second holes 310 in a second hollowed-out portion 31 is the same as the number of the types of the second mask strips 5, and the number of the second hollowed-out portions 31 included in each of the second mask plates 02 may be set according to actual needs.

In a case that the process flow of performing evaporation using the first mask plate 01 and the process flow of performing evaporation using the second mask plate 02 are in the same production line, the production time of the mask plates can be further shortened, and the problem of delaying the whole process flow due to damage of some mask plates can be further effectively avoided.

In some embodiments, the first mask plate 01 and the second mask plate 02 differ in that the first hollowed-out portion 21 and the second hollowed-out portion 31 are respectively provided in different regions of the support strip at the same position, namely, when the first mask plate 01 and the second mask plate 02 are stacked together, the orthographic projection of the first support strip 2 on the first mask plate 01 onto the second mask plate 02 coincides with the second support strip 3 on the second mask plate 02; the orthographic projection of the first hollowed-out portion 21 in the first support strip 2 onto the second mask plate 02 is located in an region outside the second region of the second support strip 3.

It should be noted that when there is no overlap between the types of the first mask strips 4 and the types of the second mask strips 5, the first mask plate 01 and the second mask plate 02 are integrated, that is, the first mask plate 01 is reused as the second mask plate 02; a mask plate has the first hollowed-out portion 21 and the second hollowed-out portion 31 at the same time. When there is overlap between the types of the first mask strips 4 and the types of the second mask strips 5, the first mask plate 01 cannot be reused as the second mask plate 02. For example, when performing evaporation of a type of first functional structure, the first mask plate 01 is used to cooperate with a corresponding type of first mask strip 4, when performing evaporation of a type of second functional structure, the second mask plate 02 is used to cooperate with a corresponding type of the second mask strip 5; the first mask strip 4 and the second mask strip 5 are the same type of mask strip; that is, when performing evaporation of the first functional structure, an effective evaporation pattern on the first mask strip 4 may expose the second hole 310 for correspondingly forming the second functional structure, as a result, when forming the first functional structure through evaporation, a evaporation material may be also evaporated at the exposed second hole 310.

In the embodiments, the second hollowed-out portion 31 includes two second holes 310, and the two second holes 310 include a fourth sub-hole 312 and a fifth sub-hole 313, where the fourth sub-hole 312 is used for evaporation to form a second functional structure (a fourth sub-functional structure 104) used to test the first property of a first colour auxiliary light-emitting layer on the display substrate, and the fifth sub-hole 313 is used for evaporation to form a second functional structure (a fifth sub-functional structure 105) used to test the first property of a second colour auxiliary light-emitting layer on the display substrate.

The number of the second holes 310 is set according to actual needs; in an implementation of the embodiments, the first color auxiliary light-emitting layer is a red auxiliary light-emitting layer, and the second color auxiliary light-emitting layer is a green auxiliary light-emitting layer, and the present disclosure is not limited thereto.

The multiple second holes 310 in the second hollowed-out portion may be small holes independent from each other, or may communicate with each other as a whole and form a large hole, and in this case, the specific position and evaporation area of the second functional structure formed by evaporation are determined by the effective evaporation pattern on the corresponding second mask strip.

The multiple second holes 310 in the second hollowed-out portion 31 include a red auxiliary hole corresponding to the evaporation position of the red auxiliary light-emitting layer, and a green auxiliary hole corresponding to the evaporation position of the green auxiliary light-emitting layer; the second mask strip 5 includes a red auxiliary mask strip for testing the first property of the red auxiliary light-emitting layer, and a green auxiliary mask strip for testing the first property of the green auxiliary light-emitting layer. When the red auxiliary mask strip cooperates with the second mask plate 02 to perform evaporation in the fourth evaporation chamber, the effective evaporation pattern on the red auxiliary mask strip corresponds to the red auxiliary hole so as to expose the position where evaporation is to be performed, and in this case, the green auxiliary hole is sheltered by the red auxiliary mask strip and cannot be used for evaporation; similarly, when the green auxiliary mask strip cooperates with the second mask plate 02 to perform evaporation in the fifth evaporation chamber, the effective evaporation pattern on the green auxiliary mask strip corresponds to the green auxiliary hole so as to expose the position where evaporation is to be performed, and in this case, the red auxiliary hole is sheltered by the green auxiliary mask strip and cannot be used for evaporation.

Figure 8:
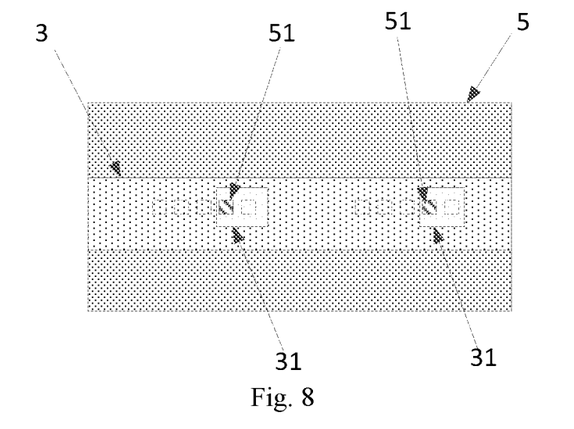
FIG. 8 shows a schematic diagram of a second mask plate cooperating with a second mask strip in embodiments of the present disclosure.
Figure 9:
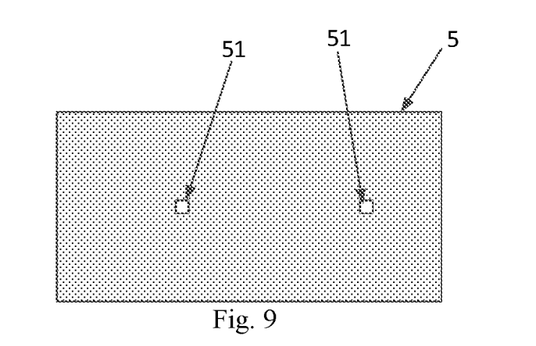
FIG. 9 shows a schematic diagram of a second mask strip in embodiments of the present disclosure.

The second mask strip 5 shown in FIGS. 8 and 9 is a red auxiliary mask strip for forming a second functional structure for testing the first property of the red auxiliary light-emitting layer, and the effective evaporation pattern thereon includes a second effective evaporation pattern 51 corresponding to the fourth sub-hole 312 in the second hollowed-out portion 31.

It should be noted that the dotted holes in FIG. 8 indicate sheltered evaporation positions, that is, the dotted holes indicate positions that are sheltered by the second mask strip 5 and cannot be used for evaporation.

In an implementation of the embodiments, the second mask plate 02 includes at least one second hollowed-out portion 31, and positions where the first hollowed-out portion 21 and the second hollowed-out portion 31 perform evaporation on the display substrate are located on the same side of the display panel region on the display substrate (the display substrate includes multiple display panels), and the present disclosure is not limited thereto.

In the embodiments, the number of the types of the second mask strips 5 is two, and an orthographic projection of an effective evaporation pattern of each of the second mask strips 5 onto the second mask plate 02 is located in a corresponding second hole 310.

During evaporation, the second mask strips 5 and the second mask plate 02 are successively stacked on the substrate where evaporation is to be performed, and the orthographic projection of the effective evaporation pattern of each of the second mask strips 5 onto the second mask plate 02 is located in the corresponding second hole 310, so that the second hole 310 exposes the effective evaporation pattern on the second mask strips 5, facilitating evaporation of a corresponding pattern.

In the embodiments, the second mask strips includes a first sub-mask strip and a second sub-mask strip, where the first sub-mask strip is used for forming a second functional structure for testing a first property of a first colour auxiliary light-emitting layer, and the second sub-mask strip is used for forming a second functional structure for testing the first property of a second colour auxiliary light-emitting layer, and the first mask strip includes a third sub-mask strip and a fourth sub-mask strip, where the third sub-mask strip is used for forming a first functional structure for testing the first property of a first colour light-emitting layer, and the fourth sub-mask strip is used for forming a first functional structure for testing the first property of a second colour light-emitting layer;

the first sub-mask strip is reused as the third sub-mask strip, namely, the same mask strip simultaneously has an effective evaporation pattern for forming a second functional structure for testing the first property of the first colour auxiliary light-emitting layer and an effective evaporation pattern for forming a first functional structure for testing the first property of the first colour light-emitting layer; the second sub-mask strip is reused as the fourth sub-mask strip, namely, the same mask strip simultaneously has an effective evaporation pattern for forming a second functional structure for testing the first property of the second colour auxiliary light-emitting layer and an effective evaporation pattern for forming a first functional structure for testing the first property of the second color light-emitting layer.

For example, when the first colour auxiliary light-emitting layer is a red auxiliary light-emitting layer and the first colour light-emitting layer is a red light-emitting layer, the first mask plate 01 cannot be reused as the second mask plate 02, namely, the first hollowed-out portion 21 and the second hollowed-out portion 31 cannot be provided on the same mask plate at the same time; and since the type of the mask strip for forming the second functional structure for testing the first property of the red auxiliary light-emitting layer is the same as the type of the mask strip for forming the first functional structure for testing the first property of the red light-emitting layer (for example, an effective evaporation pattern on a mask strip includes a first effective evaporation pattern 41 and a second effective evaporation pattern 51 at the same time; with reference to FIGS. 7 and 9), the first hollowed-out portion 21 and the second hollowed-out portion 31 are respectively located on different mask plates to avoid forming two functional structures through evaporation which cannot be formed through evaporation at the same time in the same evaporation step.

Figure 10:
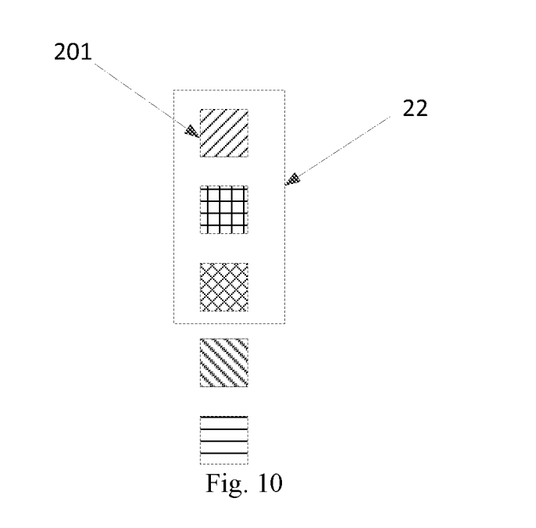
FIG. 10 shows a schematic structural diagram of a third hollowed-out portion in embodiments of the present disclosure.

In the embodiments, the mask plate assembly further includes third mask strips having different effective evaporation patterns, a third hollowed-out portion 22 having multiple third holes 201 is provided in a third region on the first support strip 2 in the first mask plate 01, and the multiple third holes 201 cooperate with multiple types of third mask strips for evaporation to form different third functional structures, with reference to FIG. 10.

It should be noted that FIG. 10 only shows a schematic diagram of a third hollowed-out 22 in the first support strip 2.

There are many contents to be tested in each chamber, such as evaporation PPA (evaporation position accuracy), film thickness, optical performance, electrical performance, etc.; therefore, a mask plate is designed with many holes, and the positions of the holes in the mask plate corresponding to different films are different. For example, the openings for performing test for the evaporation PPA (evaporation position accuracy) correspond to a side of each display panel on the display substrate, and the openings for test of the film thickness, optical performance, electrical performance, etc., correspond to the edge of the display substrate. Through cooperating of the third mask strip with the first mask plate 01, a material is evaporated at the corresponding third hole 201, so as to perform a corresponding property test.

In the embodiments, the third hollowed-out portion 22 at least includes three of third holes 201, respectively used for cooperating with the first mask plate 01 so as to be used for evaporation to form third functional structures for respectively testing the second properties of the first colour light-emitting layer, the second colour light-emitting layer and the third colour light-emitting layer.

For example, for testing the film thickness of a red light-emitting layer, a third mask strip for forming a third functional structure for testing the film thickness cooperates with the first mask plate 01, and material is evaporated at the position corresponding to the third hole 201 so as to test the film thickness of the red light-emitting layer, and in this case, material can only be evaporated at the third hole 201 corresponding to the effective evaporation pattern of the third mask strip for forming the third functional structure for testing the film thickness, while material cannot be evaporated at other third holes 201, so as to avoid interference.

It should be noted that the number of the types of the third mask strips is related to the types of the tests to be performed and the number of the objects to be tested; the number of the third holes 201 in a third hollowed-out portion 22 is related to the number of the objects to be tested; the number of the third hollowed-out portions 22 included in each of the first mask plates can be set according to actual needs. For example, for testing the film thicknesses and electrical properties of a red light-emitting layer, a green light-emitting layer and a blue light-emitting layer, the types of the third mask strips include six types, each corresponding to a test of a property of a light-emitting layer, for example, one type of mask strip is used for evaporation to form a third functional structure for testing the film thickness of a red light-emitting layer; and there are six third holes 201, respectively corresponding to the six types of third mask strips on a one-to-one basis.

It should be noted that the multiple third holes 201 in the third hollowed-out portion 22 may be multiple small holes which are independent from each other, or may communicate with each other to form a large hole (namely, the hollowed-out portion includes one hole), and in this case, the specific position and evaporation area of the third functional structure are determined by the effective evaporation pattern on the third mask strip.

Figure 11:
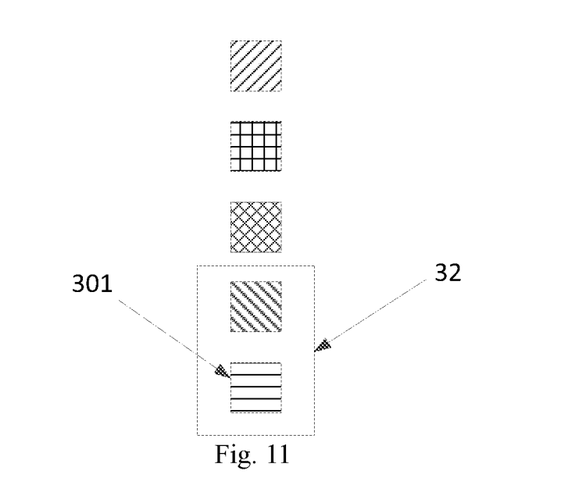
FIG. 11 shows a schematic structural diagram of a fourth hollowed-out portion in embodiments of the present disclosure.

In the embodiments, the mask plate assembly further includes fourth mask strips having different effective evaporation patterns, a fourth hollowed-out portion 32 having multiple fourth holes 301 is provided in a fourth region on the second support strip 3 in the second mask plate 02, and the multiple fourth holes 301 cooperate with multiple types of fourth mask strips for evaporation to form different fourth functional structures, with reference to FIG. 11.

It should be noted that FIG. 11 only shows a schematic diagram of a fourth hollowed-out portion 32 on the second support strip 3.

There are many contents to be tested in each chamber, such as evaporation PPA (evaporation position accuracy), film thickness, optical performance, electrical performance, etc.; therefore, a mask plate is designed with many holes, and the positions of the holes in the mask plate corresponding to different films are different; and material is evaporated at the corresponding fourth hole 301 by the fourth mask strip cooperating with the second mask plate 02, so as to perform a corresponding property test on the corresponding second functional structure.

In the embodiments, the fourth hollowed-out portion 32 at least includes two fourth holes 301 respectively used for cooperating with the second mask plate 02 so as to be used for evaporation to form fourth functional structures for respectively testing the second properties of the first colour auxiliary light-emitting layer, the second colour auxiliary light-emitting layer and the third colour auxiliary light-emitting layer.

For example, for testing the film thickness of a red auxiliary light-emitting layer, a fourth mask strip for forming a functional structure for testing the film thickness cooperates with the second mask plate 02, and material is evaporated at the position corresponding to the fourth hole 301 so as to test the film thickness of the red auxiliary light-emitting layer, and in this case, material can only be evaporated at the fourth hole 301 corresponding to the effective evaporation pattern of the fourth mask strip for forming the functional structure for testing the film thickness, while material cannot be evaporated at other fourth holes 301, so as to avoid interference.

It should be noted that the number of the types of the fourth mask strips is related to the types of the tests to be performed and the number of the test objects; the number of the fourth holes 301 in a fourth hollowed-out portion 32 is the same as the number of the types of the fourth mask strips; and the number of the fourth hollowed-out portions 32 included in each second mask plate can be set according to actual needs. For example, for respectively testing the film thicknesses and electrical properties of the red auxiliary light-emitting layer and the green auxiliary light-emitting layer, the types of the fourth mask strips include four types, each corresponding to a test for a property of an auxiliary light-emitting layer, for example, one type of mask strip is used for evaporation to form a fourth functional structure for testing the film thickness of a red auxiliary light-emitting layer; and there are four third holes, respectively corresponding to the four types of third mask strips on a one-to-one basis.

It should be noted that the multiple fourth holes 301 in the fourth hollowed-out portion 32 may be multiple small holes which are independent from each other, or may communicate with each other to form a large hole (namely, the hollowed-out portion includes one hole), and in this case, the specific position and evaporation area of the fourth functional structure are determined by the effective evaporation pattern on the fourth mask strip.

Figure 1:
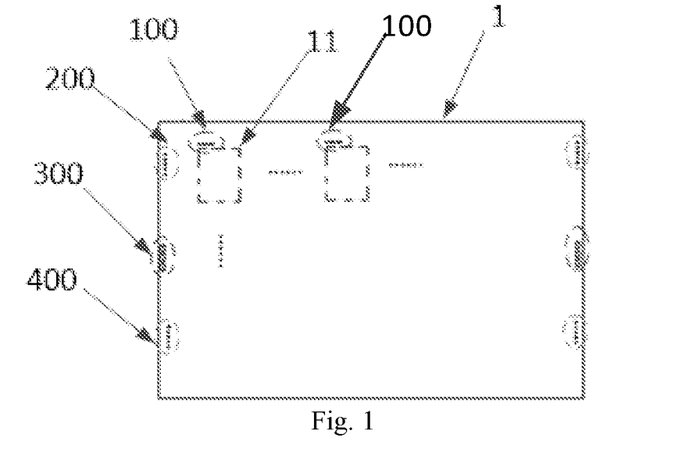
FIG. 1 shows a schematic diagram of forming a corresponding functional structure through evaporation on a display substrate where evaporation is to be performed in embodiments of the present disclosure.
Figure 2:
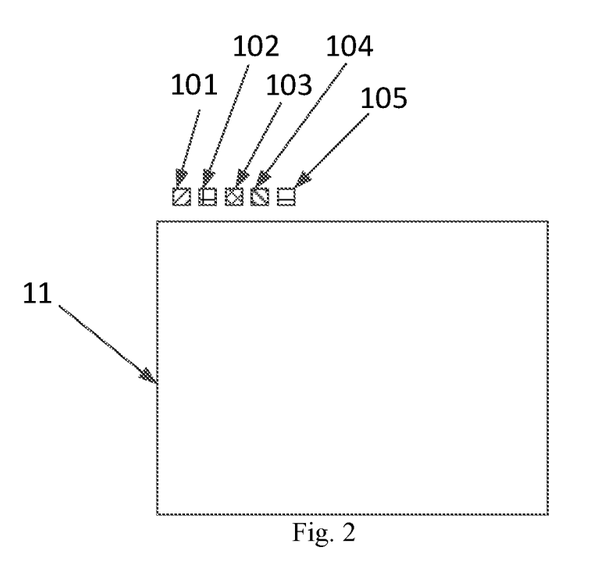
FIG. 2 shows a schematic diagram of a position of a first functional structure in embodiments of the present disclosure.

In a specific implementation of the embodiments, evaporation of functional structures for testing various properties of a red light-emitting layer (REML), a green light-emitting layer (GEML), a blue light-emitting layer (BEML), a red auxiliary light-emitting layer (RHTL) and a green auxiliary light-emitting layer (GHTL) is carried out in five evaporation chambers. The first mask plate 01 is used for evaporation to form functional structures for testing properties of a red light-emitting layer (REML), a green light-emitting layer (GEML) and a blue light-emitting layer (BEML). There are many contents to be tested in each chamber, such as evaporation PPA (evaporation position accuracy), film thickness, optical performance, electrical performance, etc.; therefore, the mask plate is designed with many holes, and the positions of the holes in the mask plate corresponding to different films are different. FIGS. 1-3 show first structures 100 (including the first functional structure and the second functional structure) for testing the PPA (evaporation position accuracy) of the corresponding films, a second structure 200 (namely, the third functional structure) for testing the film thickness, a third structure 300 for testing electrical property and a fourth structure 400 for testing optical property (namely, the fourth functional structure in the embodiments), where the display substrate 1 includes multiple display panels 11, the first structure 100 is provided on a side of each display panel 11, and the second structure 200, the third structure 300 and the fourth structure 400 are provided on the edge of the display substrate 1.

The multiple first holes 210 in the first hollowed-out portion 21 in the first mask plate 01 include a red hole corresponding to a first functional structure for testing a first property of a red light-emitting layer, a green hole corresponding to a first functional structure for testing the first property of the green light-emitting layer, and a blue hole corresponding to a first functional structure for testing the first property of the blue light-emitting layer (it needs to be explained that the first holes 210 are not painted with the colour of red, green or blue, and are merely named based on correspondingly formed structures for distinguishing); the second mask plate 02 is used to evaporate to form second functional structures for testing the first property of a red auxiliary light-emitting layer (RHTL) and a green auxiliary light-emitting layer (GHTL); and the second holes 310 in the second hollowed-out portion 31 on in second mask plate 02 includes a red auxiliary hole for forming a second functional structure for testing a first property of the red auxiliary light-emitting layer and a green auxiliary hole for forming a second functional structure for testing the first property of the green auxiliary light-emitting layer (it needs to be explained that the second holes 310 are not painted with the colour of red or green, and are differently named for the purpose of distinguishing only).

The first property is, but not limited to, an evaporation position accuracy test.

When performing evaporation of a first functional structure for testing a first property of a red light-emitting layer, an effective evaporation pattern of the corresponding first mask strip 4 corresponds to the red hole, and in this case, the green hole and the blue hole are sheltered by the first mask strip 4; likewise, when performing evaporation of a first functional structure for testing the first property of a green light-emitting layer, an effective evaporation pattern of the corresponding first mask strip 4 corresponds to the green hole, and in this case, the red hole and the blue hole are sheltered by the first mask strip 4; when performing evaporation of a first functional structure for testing the first property of the blue light-emitting layer, an effective evaporation pattern of the corresponding first mask strip 4 corresponds to the blue hole, and in this case, the green hole and the red hole are sheltered by the first mask strip 4. Principle for forming the second functional structure for testing the first property of the red auxiliary light-emitting layer and the second functional structure for testing the first property of the green auxiliary light-emitting layer by evaporation with the second mask plate 02 is the same.

In the embodiments, third mask strips are used to cooperate with the first mask plate 01 so as to test various other properties of the red light-emitting layer, the green light-emitting layer and the blue light-emitting layer except the first property; since the positions of the test holes for forming the functional structures for testing different properties are different (for example, the functional structures for the evaporation position accuracy test correspond to a side of each display panel of the display substrate, and the corresponding holes are located in the middle region of the mask plate; the functional structures for testing film thickness, electrical performance, etc., correspond to the edge of the display substrate, and the corresponding holes are located at the edge of the mask plate), the first mask plate 01 may be used to cooperate with different third mask strips, and different effective evaporation patterns on the third mask strips are used to form functional structures for different property tests, for example, when performing evaporation of a functional structure for testing the film thickness of the red light-emitting layer, the first mask plate 01 is used to cooperate with the corresponding third mask strip for evaporation.

In the embodiments, fourth mask strips are used to cooperate with the second mask plate 02 so as to test various properties of the red light-emitting layer, the green light-emitting layer and the blue light-emitting layer other than the first properties; since the positions of the test holes for forming functional structures for testing different properties are different, the second mask plate 02 may be used to cooperate with different fourth mask strips. For example, the functional structures for the evaporation position accuracy test correspond to a side of each display panel of the display substrate, and the corresponding holes are located in the middle region of the mask plate; the functional structures for testing film thickness, electrical performance, etc., correspond to the edge of the display substrate, and the corresponding holes are located at the edge of the mask plate. Different effective evaporation patterns in the fourth mask strips are used for forming the functional structures for testing different properties, for example, when performing evaporation of the functional structure for testing the film thickness of the red auxiliary light-emitting layer, the second mask plate 02 is used to cooperate with the corresponding third mask strip for evaporation.

It should be noted that in the conventional technologies, five mask plates are used to respectively complete the tests on various performances of the red light-emitting layer, the green light-emitting layer, the blue light-emitting layer, the red auxiliary light-emitting layer and the green auxiliary light-emitting layer in five evaporation chambers; when manufacturing corresponding mask plates, mold making needs to be performed five times, the cost is high and the manufacturing time is long; in practical operation, two sets of mask plates may be prepared for use, namely, ten mask plates may be prepared; and if mask plates used for evaporation of the same structure are damaged, the whole evaporation process may be delayed. In the embodiments, the mask plates used for evaporation of the functional structures for testing the properties of the red light-emitting layer, the green light-emitting layer, the blue light-emitting layer, the red auxiliary light-emitting layer and the green auxiliary light-emitting layer are divided into two types; the first mask plate 01 is used for evaporation to form functional structures for testing the multiple properties of the red light-emitting layer, the green light-emitting layer and the blue light-emitting layer; and the second mask plate 02 is used for evaporation to form functional structures for testing the multiple properties of the red auxiliary light-emitting layer and the green auxiliary light-emitting layer. In this way, when manufacturing mask plates, mold making only needs to be performed twice, saving costs and greatly reducing the time for manufacturing mask plates. In addition, in practical operation, ten mask plates are prepared (since there are five evaporation chambers); however, since the first mask plate 01 for evaporation of the functional structures for testing the properties of the red light-emitting layer, the green light-emitting layer and the blue light-emitting layer can be shared and the second mask plate 02 for evaporation of the functional structures for testing the properties of the red auxiliary light-emitting layer and the green auxiliary light-emitting layer can be shared, even if a mask plate used for evaporation of a functional structure is damaged, evaporation can be performed by using another mask plate which can be shared, so as to avoid the delay of the whole process flow.

It should be noted that, in practical applications, when forming functional structures for testing various properties of functional layers (namely, functional layers to be tested, such as a light-emitting layer) on the display substrate by evaporation, a corresponding light-emitting layer is formed by evaporation in the same step as a functional structure. Namely, multiple first holes 210 for forming different first functional structures by evaporation are provided in the first support strip 2 of the first mask plate 01, and multiple first functional region holes for forming the to-be-tested functional layers by evaporation are provided in the first support strip 2; the effective evaporation pattern on the corresponding first mask strip includes an evaporation pattern cooperating with the first hole 210 to form the first functional structure and an evaporation pattern cooperating with the first functional region hole to form a functional layer to be tested.

For example, when forming the first functional structure for testing the first property of the first colour light-emitting layer on the display substrate by evaporation with the first mask plate 01, the first functional structure is formed by evaporation at the same time as the first colour light-emitting layer. That is, the first support strip 2 of the first mask plate 01 has a first sub-hole for evaporation to form the first functional structure for testing the first property of the first colour light-emitting layer on the display substrate, and the first support strip 2 of the first mask plate 01 also has a first functional region hole for evaporation to form the first colour light-emitting layer. Referring to FIG. 13, the evaporation position of the first functional region hole 001 is shown.

Figure 15:
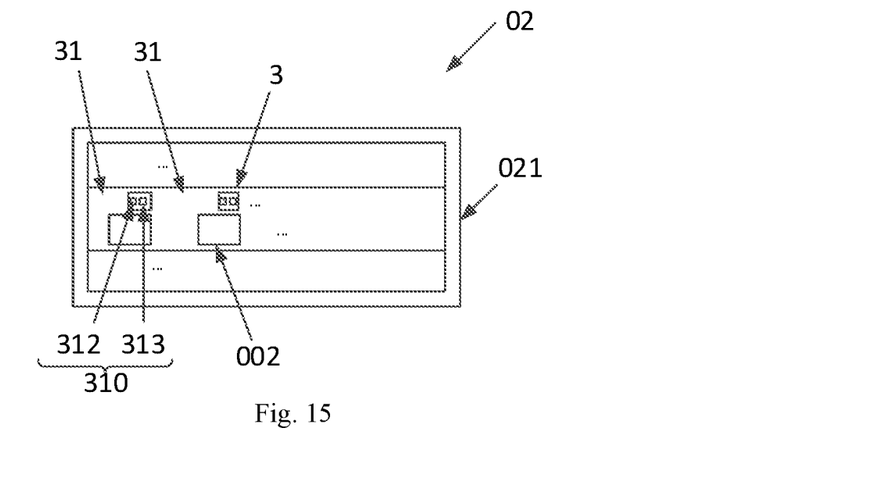
FIG. 15 shows a second schematic diagram of partial structure of a second mask plate according to embodiments of the present disclosure.

For example, when forming the second functional structure for testing the first property of the first colour auxiliary light-emitting layer with the second mask plate 02, the second functional structure is formed at the same time as the first colour auxiliary light-emitting layer. That is, the second support strip 3 of the second mask plate 02 has a fourth sub-hole used for evaporation to form the second functional structure for testing the first property of the first colour auxiliary light-emitting layer, and the second support strip 3 of the second mask plate 02 also has a second functional region hole used for evaporation to form the first colour auxiliary light-emitting layer. Referring to FIG. 15, the evaporation position of the first functional region hole 001 is shown.

It should be noted that the second mask plate shown in FIG. 15 is merely a schematic diagram showing the composition result of the second mask plate 02, where the length-width ratio of the second support strip 3 and the length-width ratio of the second frame 021 may be set according to actual needs, and are not limited. FIG. 15 merely shows that the second support strip 3 has the second hole 310 and the second functional region hole 002, and sizes, arrangement positions, etc., of the second hole 310 and the second functional region hole 002 are not limited.

The above descriptions are preferred embodiments of the present disclosure. It should be noted that those skilled in the art that can make various improvements and modifications without departing from the principle of the present disclosure, and the improvements and the modifications shall fall within the scope of protection of the present disclosure.

What is claimed is:

1. A mask plate assembly, comprising a first mask plate and a plurality of types of first mask strips having different effective evaporation patterns, wherein the first mask plate comprises a first frame and a first support strip arranged between a set of opposite sides of the first frame, a first hollowed-out portion comprising a plurality of first holes is arranged in a first region of the first support strip, and the plurality of first holes is used for cooperating with the plurality of types of first mask strips for evaporation to form different first functional structures;

wherein the first hollowed-out portion comprises three first holes, and the three first holes comprise a first sub-hole, a second sub-hole and a third sub-hole, wherein the first sub-hole is used for evaporation to form a first functional structure for testing a first property of a first colour light-emitting layer on a display substrate, the second sub-hole is used for evaporation to form a first functional structure for testing the first property of a second colour light-emitting layer on the display substrate, and the third sub-hole is used for evaporation to form a first functional structure for testing the first property of a third colour light-emitting layer on the display substrate.

2. The mask plate assembly according to claim 1, wherein the number of types of the first mask strips is three, wherein an orthographic projection of the effective evaporation pattern of each of the first mask strips onto the first mask plate is within a corresponding one of the first holes.

3. The mask plate assembly according to claim 1, further comprising a second mask plate and a plurality of types of second mask strips having different effective evaporation patterns, wherein the second mask plate comprises a second frame and a second support strip arranged between a set of opposite sides of the second frame, a second hollowed-out portion comprising a plurality of second holes is arranged in a second region of the second support strip, and the plurality of second holes is used for cooperating with the plurality of types of second mask strips for evaporation to form different second functional structures.

4. The mask plate assembly according to claim 3, wherein the second hollowed-out portion comprises two second holes, and the two second holes comprise a fourth sub-hole and a fifth sub-hole, wherein the fourth sub-hole is used for evaporation to form a second functional structure for testing the first property of a first colour auxiliary light-emitting layer on the display substrate, and the fifth sub-hole is used for evaporation to form a second functional structure for testing the first property of a second colour auxiliary light-emitting layer on the display substrate.

5. The mask plate assembly according to claim 4, wherein the number of types of the second mask strips is two, wherein an orthographic projection of the effective evaporation pattern of each of the second mask strips onto the second mask plate is within a corresponding one of the second holes.

6. The mask plate assembly according to claim 5, wherein the second mask strips comprises a first sub-mask strip and a second sub-mask strip, the first sub-mask strip is used for forming the second functional structure for testing the first property of the first colour auxiliary light-emitting layer, the second sub-mask strip is used for forming the second functional structure for testing the first property of the second colour auxiliary light-emitting layer, the first mask strips comprises a third sub-mask strip and a fourth sub-mask strip, the third sub-mask strip is used for forming the first functional structure for testing the first property of the first colour light-emitting layer, and the fourth sub-mask strip is used for forming the first functional structure for testing the first property of the second colour light-emitting layer; and wherein the first sub-mask strip is further used as the third sub-mask strip, and the second sub-mask strip is further used as the fourth sub-mask strip.

7. The mask plate assembly according to claim 1, further comprising third mask strips having different effective evaporation patterns, wherein a third hollowed-out portion having a plurality of third holes is arranged in a third region on the first support strip on the first mask plate, and the plurality of third holes is used for cooperating with the plurality of types of third mask strips for evaporation to form different third functional structures.

8. The mask plate assembly according to claim 7, wherein the third hollowed-out portion at least comprises three third holes, the three third holes are used for cooperating with the plurality of types of third mask strips for evaporation to form the third functional structures for respectively testing second properties of the first colour light-emitting layer, the second colour light-emitting layer and the third colour light-emitting layer.

9. The mask plate assembly according to claim 3, further comprising fourth mask strips having different effective evaporation patterns, wherein a fourth hollowed-out portion having a plurality of fourth holes is arranged in a fourth region on the second support strip on the second mask plate, and the plurality of fourth holes is used for cooperating with the plurality of types of fourth mask strips for evaporation to form different fourth functional structures.

10. The mask plate assembly according to claim 9, wherein the fourth hollowed-out portion at least comprises two fourth holes, the two fourth holes are used for cooperating with the plurality of types of fourth mask strips for evaporation to form the fourth functional structures for respectively testing the second properties of a first colour auxiliary light-emitting layer, and a second colour auxiliary light-emitting layer.

11. The mask plate assembly according to claim 1, wherein the first property comprises evaporation position accuracy.

12. The mask plate assembly according to claim 8, wherein the second property comprises a film thickness, or an optical performance, or an electrical performance.

* * * * *